United States Patent
Motomura et al.

(10) Patent No.: US 12,119,202 B2
(45) Date of Patent: Oct. 15, 2024

(54) MECHANISM FOR ADJUSTING ANGLE OF INCIDENCE ON CHARGED PARTICLE BEAM APERTURE, AND CHARGED PARTICLE BEAM DEVICE

(71) Applicant: Hitachi High-Tech Corporation, Tokyo (JP)

(72) Inventors: Shunichi Motomura, Tokyo (JP); Tsunenori Nomaguchi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 337 days.

(21) Appl. No.: 17/783,430

(22) PCT Filed: Dec. 12, 2019

(86) PCT No.: PCT/JP2019/048652
§ 371 (c)(1),
(2) Date: Jun. 8, 2022

(87) PCT Pub. No.: WO2021/117182
PCT Pub. Date: Jun. 17, 2021

(65) Prior Publication Data
US 2024/0029992 A1 Jan. 25, 2024

(51) Int. Cl.
*H01J 37/15* (2006.01)
*H01J 37/09* (2006.01)
(Continued)

(52) U.S. Cl.
CPC .............. *H01J 37/15* (2013.01); *H01J 37/09* (2013.01); *H01J 37/153* (2013.01); *H01J 37/21* (2013.01); *H01J 2237/1534* (2013.01)

(58) Field of Classification Search
CPC .......... H01J 37/15; H01J 37/153; H01J 37/09; H01J 37/21; H01J 2237/0458
See application file for complete search history.

(56) References Cited

U.S. PATENT DOCUMENTS

2018/0114670 A1* 4/2018 Kawasaki ............. H01J 37/145
2021/0027977 A1* 1/2021 Motomura ............ H01J 37/153

FOREIGN PATENT DOCUMENTS

| JP | 47-31057 U | 12/1972 |
|----|------------|---------|
| JP | 2-18845 A  | 1/1990  |

(Continued)

OTHER PUBLICATIONS

International Search Report (PCT/ISA/210) issued in PCT Application No. PCT/JP2019/048652 dated Feb. 18, 2020 with English translation (four (4) pages).

(Continued)

*Primary Examiner* — David E Smith
(74) *Attorney, Agent, or Firm* — Crowell & Moring LLP (57) ABSTRACT

Provided is a charged particle beam device capable of stably obtaining an effect of improving the depth of focus or the effect of correcting spherical aberration. The charged particle beam device includes an aperture having an annular slit or an electrode having an annular slit and is provided with means for adjusting the incident angle at which the charged particle beam is incident on the aperture or the electrode. Since the incident angle at which the charged particle beam is incident on the aperture or electrode having an annular slit can be made closer to perpendicular, the effect of improving the depth of focus or the effect of correcting spherical aberration can be stably obtained.

16 Claims, 9 Drawing Sheets

(51) Int. Cl.
*H01J 37/153* (2006.01)
*H01J 37/21* (2006.01)

(56) References Cited

FOREIGN PATENT DOCUMENTS

| JP | 2002-25488 A | 1/2002 |
| JP | 2011-14299 A | 1/2011 |
| WO | WO 2016/174891 A1 | 11/2016 |
| WO | WO 2019/186936 A1 | 10/2019 |

OTHER PUBLICATIONS

Japanese-language Written Opinion (PCT/ISA/237) issued in PCT Application No. PCT/JP2019/048652 dated Feb. 18, 2020 (seven (7) pages).
Enyama, M. et al., "Method of improving image sharpness for annular-illumination scanning electron microscopes," Japanese Journal of Applied Physics 55, 06GD02 (2016), five (5) pages.

* cited by examiner

MECHANISM FOR ADJUSTING ANGLE OF INCIDENCE ON CHARGED PARTICLE BEAM APERTURE, AND CHARGED PARTICLE BEAM DEVICE

TECHNICAL FIELD

The present invention relates to a charged particle beam device that irradiates a sample with a charged particle beam.

BACKGROUND ART

A charged particle beam device such as a scanning electron microscope (SEM) and a focused ion beam system (FIB) performs nano-level observation, analysis, and processing by focusing a charged particle beam on a sample. These charged particle beam devices are widely used in the fields of semiconductors, materials, and biotechnology, which require nano-level observation, analysis, and processing. Further, in various fields, including the semiconductor field where miniaturization is advancing, further improvement in image resolution and processing accuracy are required.

WO-A-2016/174891 (PTL 1) discloses a spherical aberration correction device that can be realized with a simple structure in which an entry plate and an exit plate are included, a circular opening is formed on one of them, an annular opening is formed on the other, and a voltage is applied between the entry plate and the exit plate to form an electric field in the annular opening, thereby causing divergence that eliminates positive spherical aberration. Further, Non-PTL 1 indicates that the depth of focus is improved by using an annular aperture.

Further, WO-A-2019/186936 (PTL 2) discloses a method of arranging a charged particle beam aperture having an annular shape at an appropriate position of a charged particle beam device.

CITATION LIST

Patent Literature

PTL 1: WO-A-2016/174891
PTL 2: WO-A-2019/186936

Non-Patent Literature

Non-PTL 1: Momoyo Enyama, Koichi Hamada, Muneyuki Fukuda and Hideyuki Kazumi, "Method of improving image sharpness for annular-illumination scanning electron microscopes," Japanese Journal of Applied Physics 55, 06GD02 (2016)

SUMMARY OF INVENTION

Technical Problem

As an aperture of a charged particle beam device, an opening having a circular hole shape is generally used, but an annular aperture is also known. Non-PTL 1 shows that the depth of focus is improved by using an annular aperture. Further, PTL 1 shows that a spherical aberration correction effect can be obtained by combining an annular electrode and a circular hole-shaped electrode and applying a voltage between the two electrodes.

In the study by the inventors, it was found that even if the optical axis of the charged particle beam is arranged so as to pass through the center of the aperture or electrode having an annular slit, it may not be able to sufficiently improve the depth of focus or to eliminate the spherical aberration. The charged particle beam in the charged particle beam device does not travel along the ideal optical axis extending in the vertical direction, but actually deviates from the optical axis in the emission direction of the primary electron emitted from the charged particle beam source, or travels in a direction deviated from the optical axis due to the influence of mounting misalignment of a lens or the like. By correcting the orbit of the primary electron by the action of the deflector of the optical system or the like, the influence of the above-mentioned deviation is absorbed. Therefore, it commonly happens that the charged particle beam is not perpendicularly incident on the plane on which the aperture or electrode is formed even if the charged particle beam is adjusted to pass through the center of the aperture or electrode having an annular slit. In the case of an aperture or electrode having an annular slit, the central portion having the highest beam density is shielded and only the peripheral portion having a low beam density passes through the annular slit. Therefore, if the light is not accurately perpendicularly incident, the charged particle beam density of the charged particle beam passing through the annular slit becomes non-uniform, it cannot be focused on the same location on the sample, the beam diameter increases, and the desired performance cannot be obtained. The present invention provides a charged particle beam device capable of stably obtaining an effect of improving the depth of focus or an effect of spherical aberration correction.

Solution to Problem

The charged particle beam device is provided with means for adjusting the incident angle of the charged particle beam on an aperture having an annular slit or an electrode having an annular slit.

Advantageous Effects of Invention

Since the incident angle at which the charged particle beam is incident on the aperture or electrode having an annular slit can be made closer to perpendicular, the effect of improving the depth of focus or the effect of correcting spherical aberration can be stably obtained.

Other issues and novel features will become apparent from the description and accompanying drawings in the present specification.

DESCRIPTION OF EMBODIMENTS

Embodiments of the present invention will be described with reference to the drawings. However, the present embodiment is merely an example of implementing the present invention. Further, the same reference numerals are denoted to the common configurations in each drawing.

First Embodiment

Figure 1:
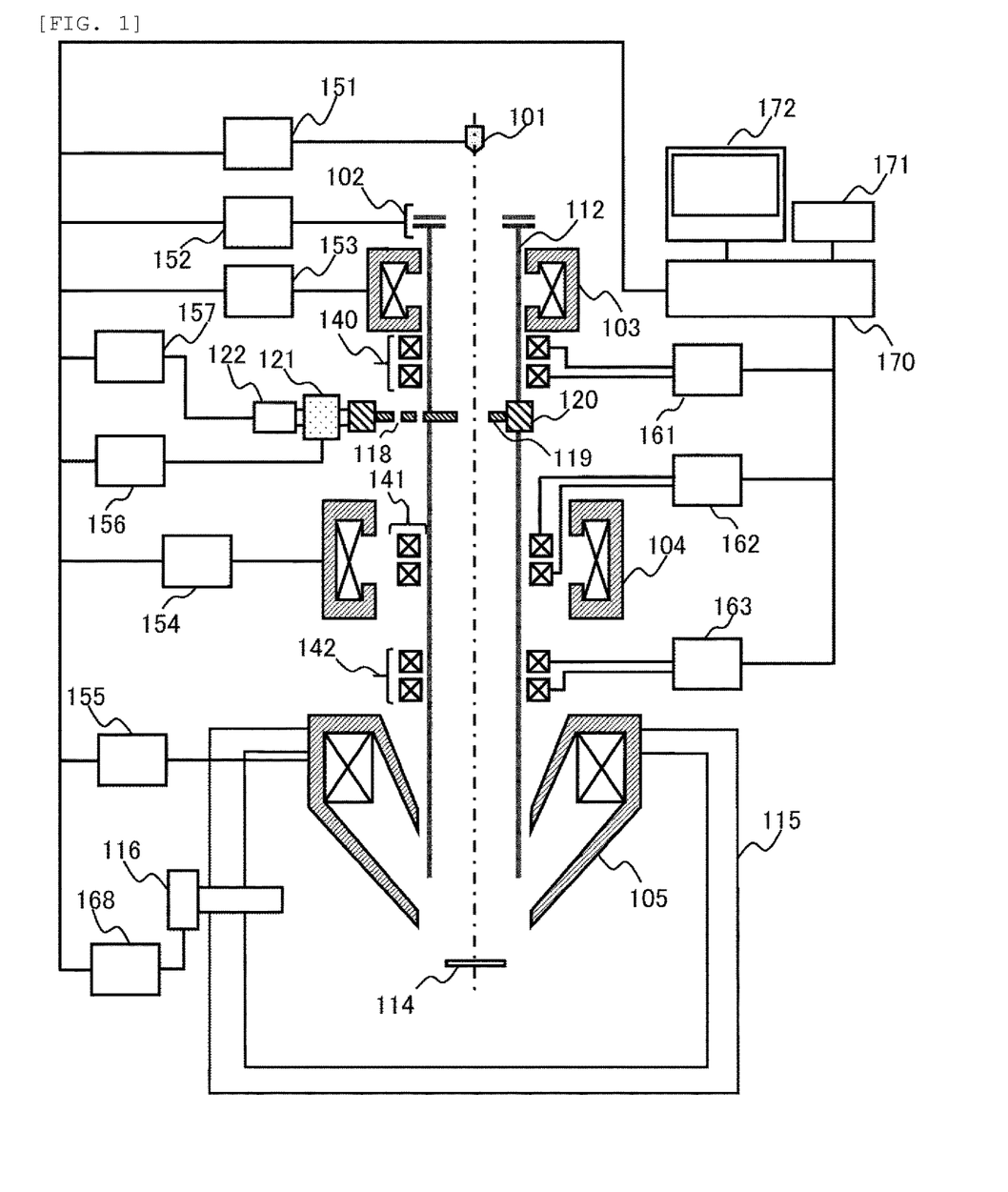
FIG. 1 is a schematic diagram of a charged particle beam device of a first embodiment.

FIG. 1 shows an outline of a charged particle beam device according to the first embodiment. The main part of the charged particle beam device includes a charged particle beam source 101 that generates a charged particle beam, an acceleration electrode 102 that accelerates the charged particle beam emitted from the charged particle beam source 101, a beam tube 112 arranged near the lower end of an objective lens 105 from the acceleration electrode 102, first and second condenser lenses 103 and 104 that focus the charged particle beam emitted from the charged particle beam source 101, a first charged particle beam aperture 118 having an annular slit that shields a part of the charged particles emitted from the charged particle beam source 101, a second charged particle beam aperture 119 having a circular hole-shaped opening that shields a part of the charged particles emitted from the charged particle beam source 101, an aperture holder 120 that holds the first and second charged particle beam apertures 118 and 119, an aperture tilting mechanism 121 that inclines the aperture holder 120, an aperture position adjusting mechanism 122 that translates the aperture holder 120, a first deflector group 140 arranged on the charged particle beam source 101 side of the charged particle beam aperture, a second deflector group 141 arranged on the sample side of the charged particle beam aperture, a third deflector group 142 that scans the charged particle beam on the sample, the objective lens 105 that focuses the charged particle beam on the sample, a sample chamber 115 in which a sample 114 is arranged, and a detector 116 that detects secondary charged particles emitted from the sample. Further, as the controllers for controlling each component of the charged particle optical system described above, a charged particle source controller 151 that controls the charged particle beam source 101, an acceleration electrode controller 152 that controls the acceleration electrode 102, first and second condenser lens controllers 153 and 154 that control the first and second condenser lenses 103 and 104, an aperture tilting mechanism controller 156 that controls the aperture tilting mechanism 121, an aperture position adjusting mechanism controller 157 that controls the aperture position adjusting mechanism 122, a first deflector group controller 161 that controls the first deflector group 140, a second deflector group controller 162 that controls the second deflector group 141, a third deflector group controller 163 that controls the third deflector group 142, an objective lens controller 155 that controls the objective lens 105, and a detector controller 168 that controls the detector 116 are provided. These controllers are controlled by an integrated computer 170 that controls the operation of the entire charged particle beam device and constructs a charged particle beam image. The integrated computer 170 is connected to a controller (keyboard, mouse, and the like) 171, and a display 172, and the operator can input various instructions such as irradiation conditions and position conditions of a charged particle beam aperture from the controller 171 and the acquired image and the control screen can be displayed on the display 172.

In the example of FIG. 1, two condenser lenses 103 and 104 are provided, but the number of condenser lenses does not matter for the purpose of controlling the charged particle beam incident on the objective lens 105. The objective lens 105 includes a type of lens that does not leak the magnetic field outside the magnetic path but may be a type of lens that leaks the magnetic field outside the magnetic path and may be a compound objective lens that includes both a type that leaks the magnetic field and a type that does not leak the magnetic field. Further, the condenser lenses 103 and 104 and the objective lens 105 may be an electrostatic lens for the above-mentioned purpose or may be an objective lens in which a magnetic field lens and an electrostatic lens are used in combination, such as a booster optical system and a retarding optical system. The type of lens does not matter for the purpose of focusing the charged particle beam on the sample 114.

Further, the detector 116 for detecting the secondary charged particles may be arranged in the sample chamber 115 as shown in FIG. 1 or may be arranged in a column in which the charged particle optical system is mounted. Further, it may be arranged both in the sample chamber 115 and in the column. For the purpose of detecting secondary charged particles, the number and location thereof are not limited. Further, FIG. 1 shows a charged particle beam device including one charged particle beam column, but a composite charged particle beam device including a plurality of charged particle beam columns may also be used.

Figure 2A:
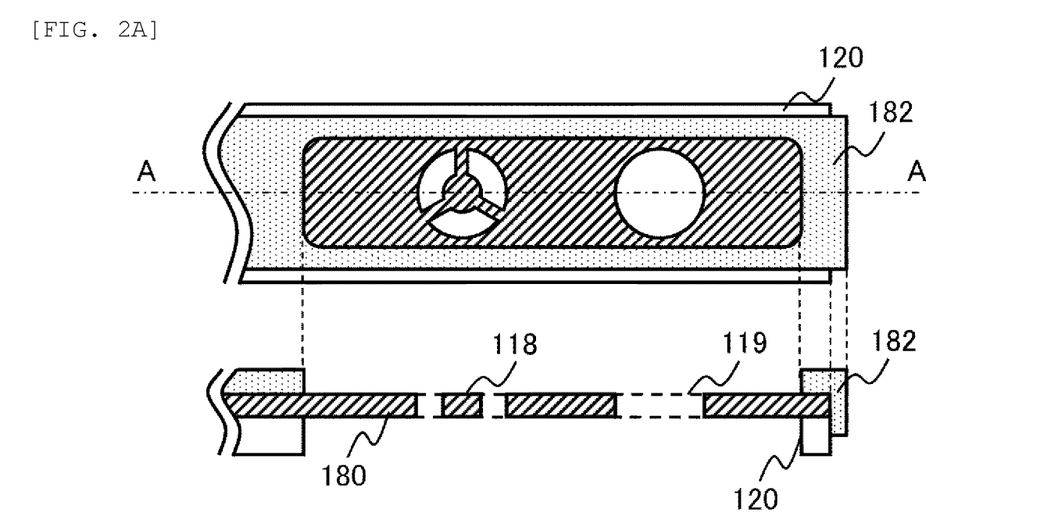
FIG. 2A is a diagram illustrating the configuration of a charged particle beam aperture.

The configuration of the charged particle beam aperture will be described with reference to FIGS. 2A to 2C. FIG. 2A shows a state in which the first charged particle beam aperture 118 and the second charged particle beam aperture 119 are formed on one plate 180, and the plate 180 is held by the aperture holder 120. FIG. 2A shows a top view and a cross-sectional view taken along line A-A in the top view. The plate 180 is fixed to the aperture holder 120 by a holding plate 182.

The first charged particle beam aperture 118 and the second charged particle beam aperture 119 may be formed on different plates. Further, the annular central portion of the first charged particle beam aperture 118 is supported by three support portions, but the number of support portions does not matter. Further, as long as the first charged particle beam aperture 118 and the second charged particle beam aperture 119 are each included one or more, the number thereof does not matter. The plate 180 is covered with a chemically inert conductor such as Pt in order to suppress charging due to irradiation of charged particle beams.

Figure 2B:
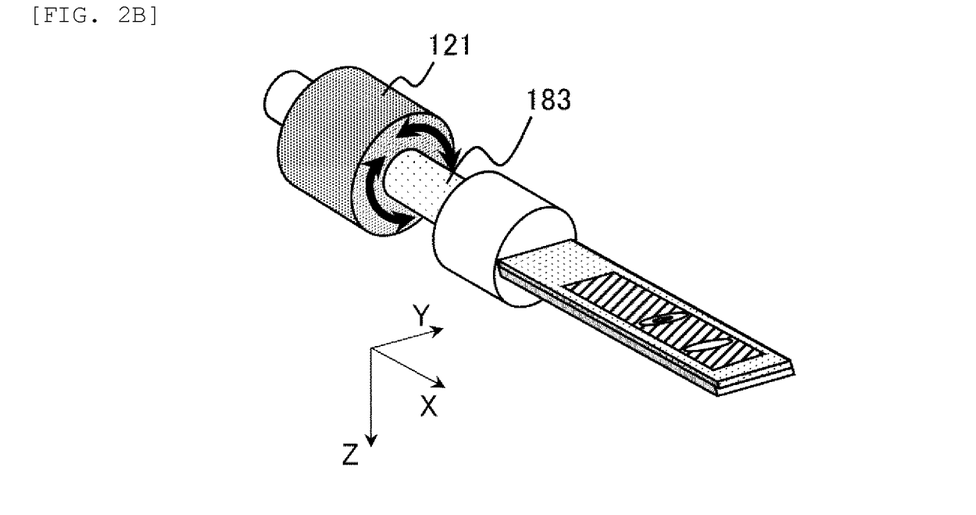
FIG. 2B is a diagram illustrating the configuration of the charged particle beam aperture.

As shown in FIG. 2B, the aperture holder 120 is connected to the aperture tilting mechanism 121 via a support member 183. Here, the direction parallel to the optical axis is defined as the Z direction, and the plane perpendicular to the Z direction is defined as the XY plane. Further, the XY plane is a plane stretched by an X axis passing through the center of the first charged particle beam aperture 118 and the center of the second charged particle beam aperture 119, and a Y axis perpendicular to the X axis. In the example of FIG. 2B, the aperture tilting mechanism 121 tilts the plate 180 with the support member 183 as an axis. That is, the first charged particle beam aperture 118 and the second charged particle beam aperture 119 are inclined with the X axis as an axis. The configuration of FIG. 2B has one tilt axis (X-axis), whereas the configuration of FIG. 2C has two tilt axes (X-axis and Y-axis). This enables more precise tilt control. A first aperture tilting mechanism 121*a* tilts the first charged particle beam aperture 118 and the second charged particle beam aperture 119 with the X-axis as an axis, and a second aperture tilting mechanism 121*b* tilts the first charged particle beam aperture 118 and the second charged particle beam aperture 119 with the Y-axis as an axis.

Figure 2C:
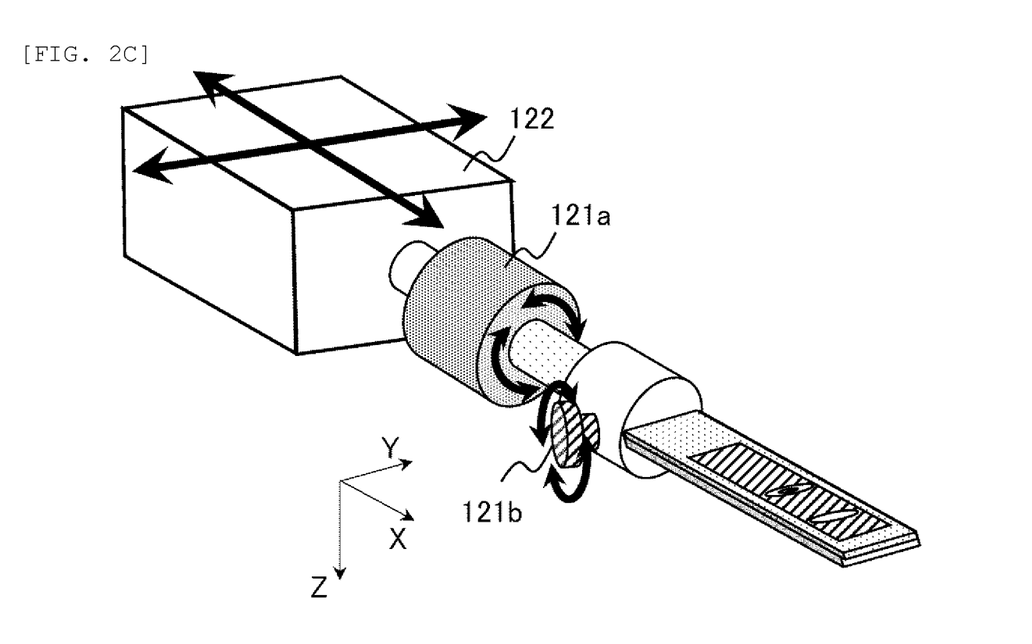
FIG. 2C is a diagram illustrating the configuration of the charged particle beam aperture.

Further, the aperture tilting mechanism 121 (121*a*) is connected to the aperture position adjusting mechanism 122 as shown in FIG. 2C. The aperture position adjusting mechanism 122 allows the plate 180 to be translated. As shown in the drawing, the direction in which translation is possible is preferably two or more (in this example, the X-axis direction and the Y-axis direction). The aperture tilting mechanism 121 and the aperture position adjusting mechanism 122 may be driven manually or may be electrically driven with a stepping motor or a piezo element.

A method of adjusting a charged particle beam aperture having an annular slit will be described. In the present embodiment, first, adjustments necessary for acquiring a charged particle beam image including an optical axis adjustment of the charged particle beam for the second charged particle beam aperture 119 having a circular hole-shaped opening are performed. Since the aperture of a circular hole-shaped opening is a general shape of a charged particle beam aperture, this adjustment is an operation normally performed by a user with a general charged particle beam device. Next, the second charged particle beam aperture 119 having a circular hole-shaped opening is changed to the first charged particle beam aperture 118 having an annular slit. At this time, the first charged particle beam aperture 118 is arranged at the position where the second charged particle beam aperture 119 has been arranged. Finally, the resolutions are evaluated between the image acquired by arranging the first charged particle beam aperture 118 and the image acquired by arranging the second charged particle beam aperture 119, and the tilt of the first charged particle beam aperture 118 is adjusted. The specific adjustment procedure will be described below. In these adjustment procedures, each controller of the charged particle optical system is controlled and carried out by the integrated computer 170.

Figure 3:
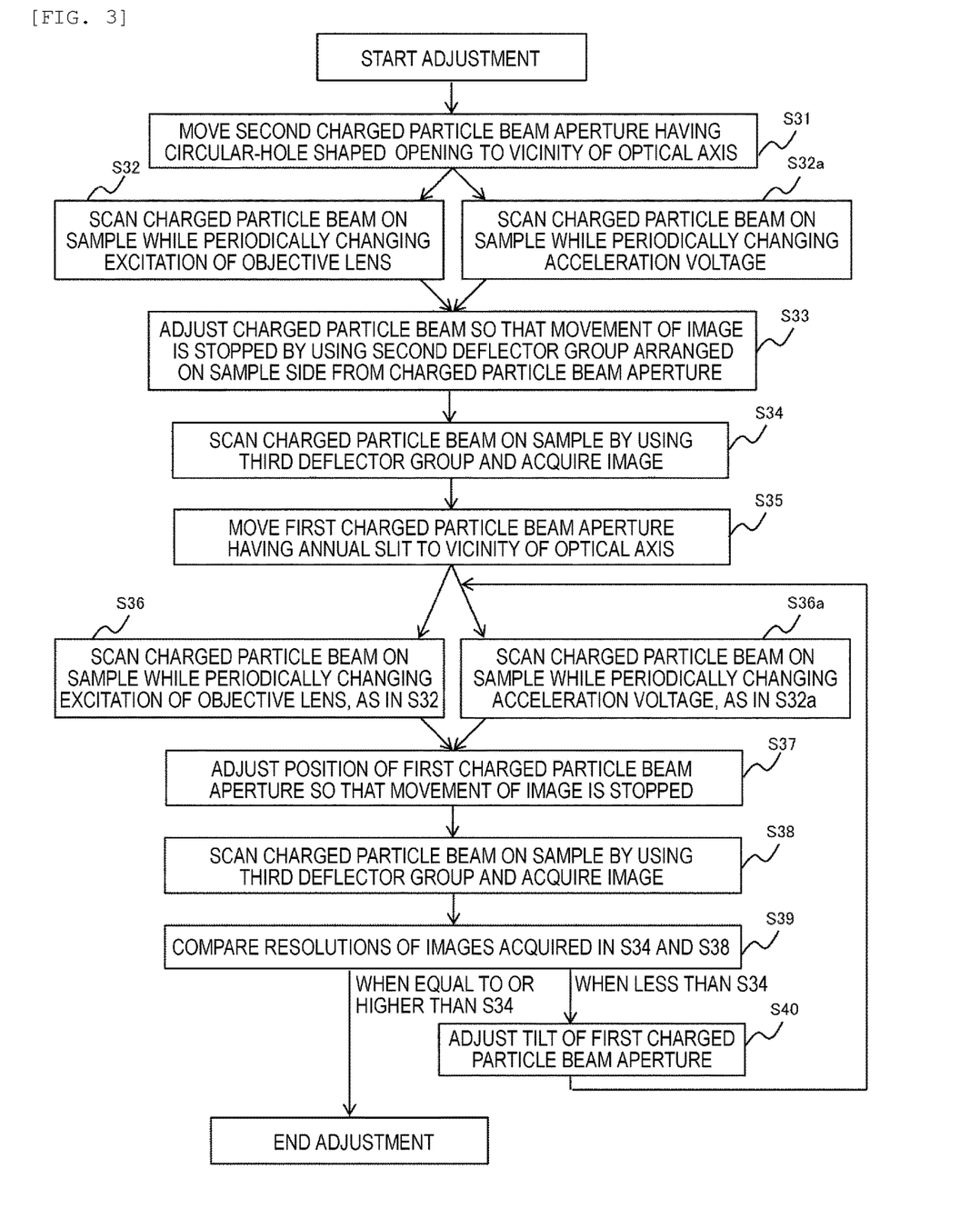
FIG. 3 is a flowchart showing a procedure for adjusting the incident angle of the charged particle beam to the aperture having an annular slit.

The procedure for adjusting the incident angle of the charged particle beam on the aperture in the charged particle beam device of the first embodiment will be described with reference to FIG. 3. First, the second charged particle beam aperture 119 having a circular hole-shaped opening is moved to the vicinity of the optical axis of the charged particle beam (step S31). The charged particle beam is scanned on the sample by the third deflector group 142 while periodically changing the excitation of the objective lens 105 (step S32). At that time, if the optical axis does not pass through the center of the objective lens 105, the center of the displayed image moves in synchronization with the excitation fluctuation of the objective lens 105. Therefore, the path of the charged particle beam is adjusted so that the movement of the image is stopped by using the second deflector group 141 arranged on the sample side from the charged particle beam aperture (step S33). The state in which the movement of the image is stopped corresponds to the charged particle beam passing through the center of the objective lens 105. The above procedure is an optical axis adjustment performed in a general charged particle beam device. After the optical axis adjustment is completed, the charged particle beam is scanned on the sample by the third deflector group 142, and an image is acquired (step S34).

Next, the first charged particle beam aperture 118 having an annular slit is moved to the vicinity of the optical axis (step S35). Similar to step S32, the charged particle beam is scanned on the sample while periodically changing the excitation of the objective lens 105 (step S36). The position of the first charged particle beam aperture 118 is adjusted by using the aperture position adjusting mechanism 122 so that the movement of the image is stopped (step S37). This corresponds to the fact that the optical axis of the charged particle beam in the state where the second charged particle beam aperture 119 is inserted is adjusted to pass through the center of the first charged particle beam aperture 118. After that, the image is acquired in the same manner as in step S34 (step S38).

In steps S32 and S36 described above, instead of periodically changing the excitation of the objective lens 105, the same adjustment can be made by periodically changing the acceleration voltage of the charged particle beam by the acceleration electrode controller 152 (steps S32*a* and S36*a*).

After that, the resolutions of the images acquired in step S34 and step S38 are compared (step S39). When the resolution of the image acquired in step S38 is equal to or higher than the resolution of the image acquired in step S34, the adjustment is terminated. On the other hand, if it is less than the same, the tilt angle of the first charged particle beam aperture 118 is adjusted by using the aperture tilting mechanism 121 while scanning on the sample with the third deflector group (step S40). After that, the steps following step S36 (S36*a*) are repeatedly executed as necessary, and when the resolution of the image acquired in step S38 is equal to or higher than the resolution of the image acquired in step S34, the adjustment is terminated. The improvement in resolution is due to the fact that the incident angle of the charged particle beam on the first charged particle beam aperture 118 is adjusted, and the verticality between the optical axis of the charged particle beam and the first charged particle beam aperture 118 is improved.

The inclination of the charged particle beam aperture may be adjusted once when the charged particle beam device is installed and then every time the charged particle beam source 101 is replaced. This is because when replacing a charged particle beam source, it is not possible to make it completely match the emission directions of the charged particle beam source and the charged particle beam before the replacement.

By adjusting the inclination of the aperture having an annular slit in this way, the optical axis of the charged particle beam can be incident perpendicular to the center of the aperture. As a result, the density of the charged particle beam passing through the annular slit becomes uniform, and the charged particle beam divided by the slit in the aperture is focused on the same location on the sample. As a result, the effect of improving the depth of focus by the aperture having the annular slit can be stably obtained.

Second Embodiment

Figure 4:
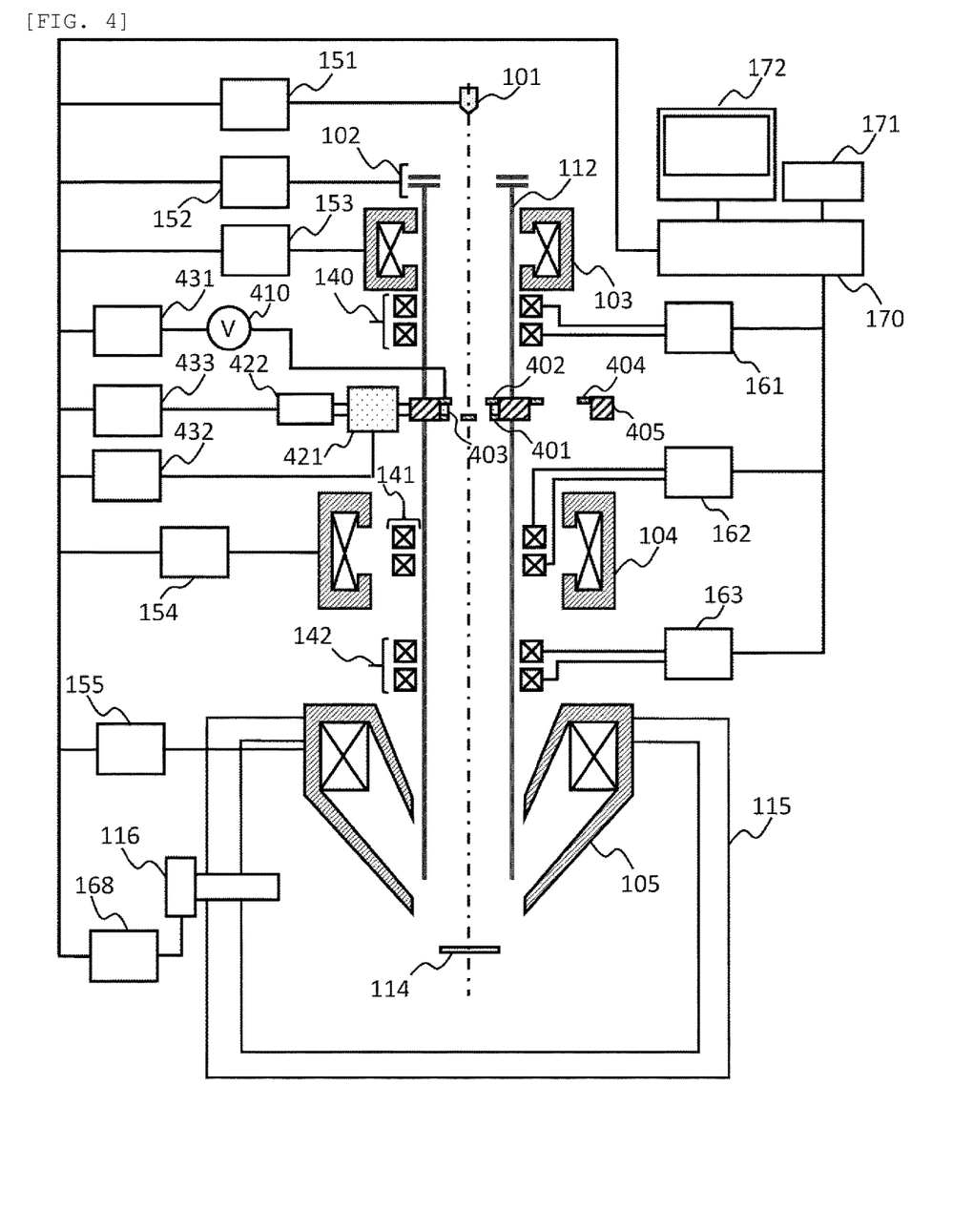
FIG. 4 is a schematic diagram of a charged particle beam device of a second embodiment.

FIG. 4 shows an outline of a charged particle beam device according to the second embodiment. The configurations common to the charged particle beam device according to the first embodiment are denoted by the same reference numerals and overlapping descriptions will be omitted. In the charged particle beam device according to the second embodiment, a first charged particle beam electrode 401 having an annular slit, a second charged particle beam electrode 402 having a circular hole-shaped opening, an insulating member 403 for electrically insulating the first charged particle beam electrode 401 and the second charged particle beam electrode 402, and a charged particle beam aperture 404 having a circular hole-shaped opening are held in an electrode holder 405. The first charged particle beam electrode 401 has the same structure as the first charged particle beam aperture 118 of the first embodiment, and the second charged particle beam electrode 402 and the charged particle beam aperture 404 have the same structure as the second charged particle beam aperture 119 of the first embodiment as elements. Further, an electrode power supply 410 for applying a voltage to the second charged particle beam electrode 402 and an electrode power supply controller 431 for controlling the electrode power supply 410 are provided.

In the example of FIG. 4, the first charged particle beam electrode 401 is electrically connected to the beam tube 112 and a different voltage is applied to the second charged particle beam electrode 402. But, the charged particle beam electrode 402 may be electrically connected to the beam tube 112 and a different voltage may be applied to the first charged particle beam electrode 401, or a configuration in which both the first charged particle beam electrode 401 and the second charged particle beam electrode 402 can be applied with a different voltage from that of the beam tube 112 may be applied. In this case, a power supply for applying a voltage is provided to each of the first charged particle beam electrode 401 and the second charged particle beam electrode 402.

Figure 5A:
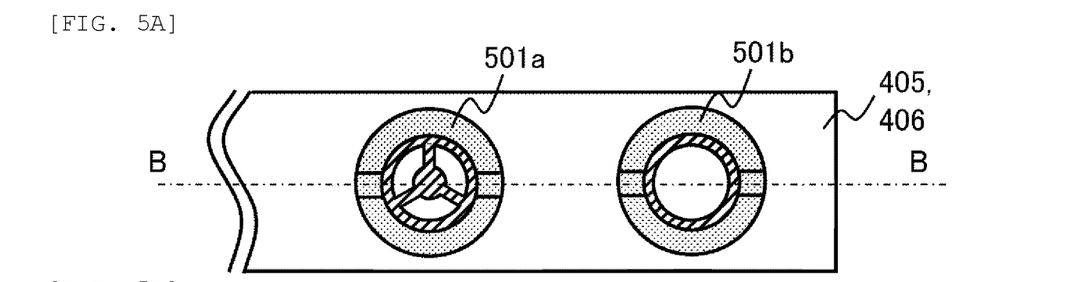
FIG. 5A is a diagram illustrating the configuration of a charged particle beam electrode.
Figure 5B:
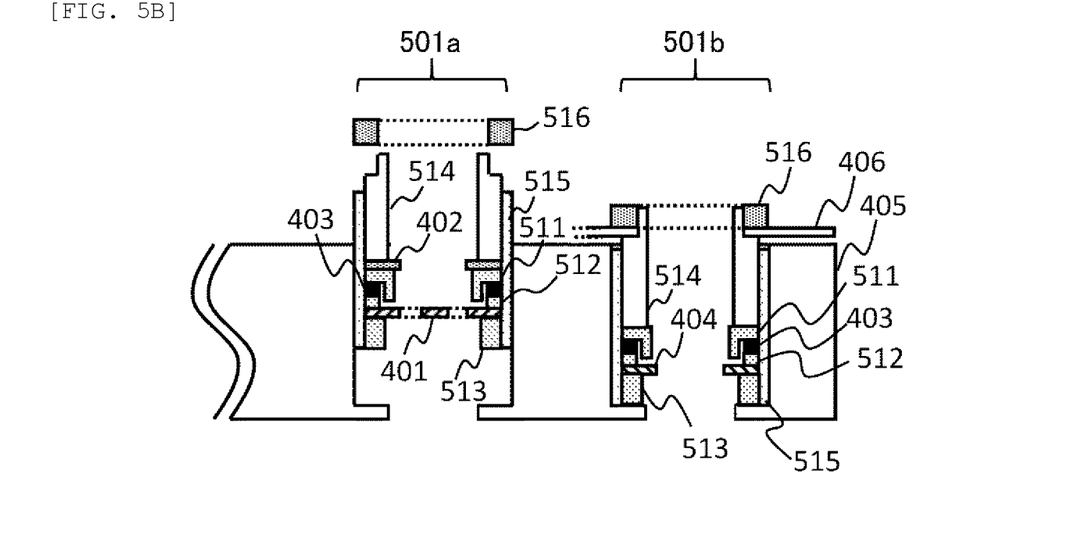
FIG. 5B is a diagram illustrating the configuration of the charged particle beam electrode.

The configuration of the charged particle beam electrode will be described with reference to FIGS. 5A to 5D. FIG. 5A shows a top view of the electrode holder and FIG. 5B shows a cross-sectional view taken along line B-B of FIG. 5A. In the electrode holder 405, an electrode unit 501a in which the first and second charged particle beam electrodes 401 and 402 are housed, and an electrode unit 501b in which the charged particle beam aperture 404 is housed are held in the electrode holder 405. The number of electrode units held by the electrode holder 405 may be 2 or more.

FIG. 5B shows a state in which the electrode unit 501b is fixed to the electrode holder 405. The electrode unit 501 is fixed to the electrode holder 405 by a holding screw 516 via a holding plate 406 and can be attached to and detached from the electrode holder 405 unit-by-unit. The unit-by-unit replaceable configuration facilitates replacement when the charged particle beam electrode or charged particle beam aperture is contaminated, or replacement when the user desires a combination of a plurality of charged particle beam electrodes.

The configuration of the electrode unit will be described. In the electrode unit 501a in which the charged particle beam electrode is housed, in a cylindrical insulating case 515 having an outer diameter corresponding to the hole for holding the electrode unit of the electrode holder 405, a lower spacer 513, the first charged particle beam electrode 401, a middle spacer 512, the insulating member 403, an upper spacer 511, the second charged particle beam electrode 402, and an electrode retainer 514 are arranged in this order from the bottom. It is desirable that the insulating member 403 is arranged so as not to be seen from the path of the charged particle beam in order to prevent charging. Therefore, as shown in FIG. 5B, the insulating member 403 is arranged between the upper spacer 511 having a small inner diameter, and the middle spacer 512 having a large inner diameter, and the charged particle beam passes through the opening of the upper spacer 511. The side surface of the insulating member 403 is covered by the inner wall of the upper spacer 511 and the insulating member 403 is obscured from the path of the charged particle beam.

The spacers 511 to 513, the electrodes 401 and 402, and the electrode retainer 514 are conductors, and the first charged particle beam electrode 401 is electrically connected to the electrode holder 405 via the lower spacer 513, and the electrode holder 405 is electrically connected to the beam tube 112, whereby the first charged particle beam electrode 401 has an equal potential (ground potential) with the beam tube 112. On the other hand, the second charged particle beam electrode 402 is connected to the electrode power supply 410 via the electrode retainer 514, and the voltage generated by the electrode power supply 410 is applied.

The electrode unit 501b in which the charged particle beam aperture 404 is housed has the same configuration as the electrode unit 501a. That is, in the insulating case 515, the lower spacer 513, the charged particle beam aperture 404, the middle spacer 512, the insulating member 403, the upper spacer 511, and the electrode retainer 514 are arranged in this order from the bottom.

Figure 5C:
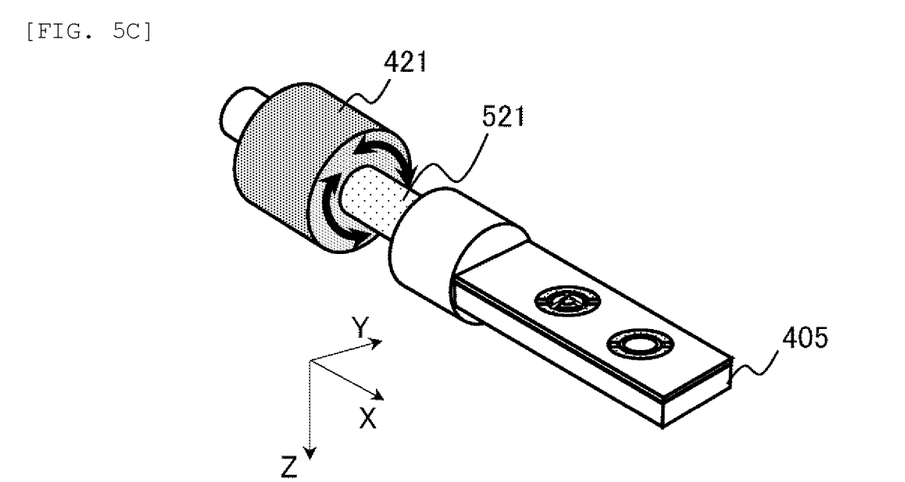
FIG. 5C is a diagram illustrating the configuration of the charged particle beam electrode.

As shown in FIG. 5C, the electrode holder 405 is connected to an electrode tilting mechanism 421 via a support member 521. Here, the direction parallel to the optical axis is defined as the Z direction, and the plane perpendicular to the Z direction is defined as the XY plane. Further, the XY plane is a plane stretched by an X axis passing through the center of the first charged particle beam electrode 401 and the center of the charged particle beam aperture 404, and a Y axis perpendicular to the X axis. In the example of FIG. 5C, the electrode tilting mechanism 421 tilts the electrode holder 405 with the support member 521 as an axis. That is, the electrode unit 501a and the electrode unit 501b are tilted with the X axis as an axis. The configuration of FIG. 5C has one tilt axis (X-axis), whereas the configuration of FIG. 5D has two tilt axes (X-axis and Y-axis). This enables more precise tilt control. A first electrode tilting mechanism 421a tilts the electrode units 501a and 501b with the X axis as an axis, and a second electrode tilting mechanism 421b tilts the electrode units 501a and 501b with the Y axis as an axis.

Figure 5D:
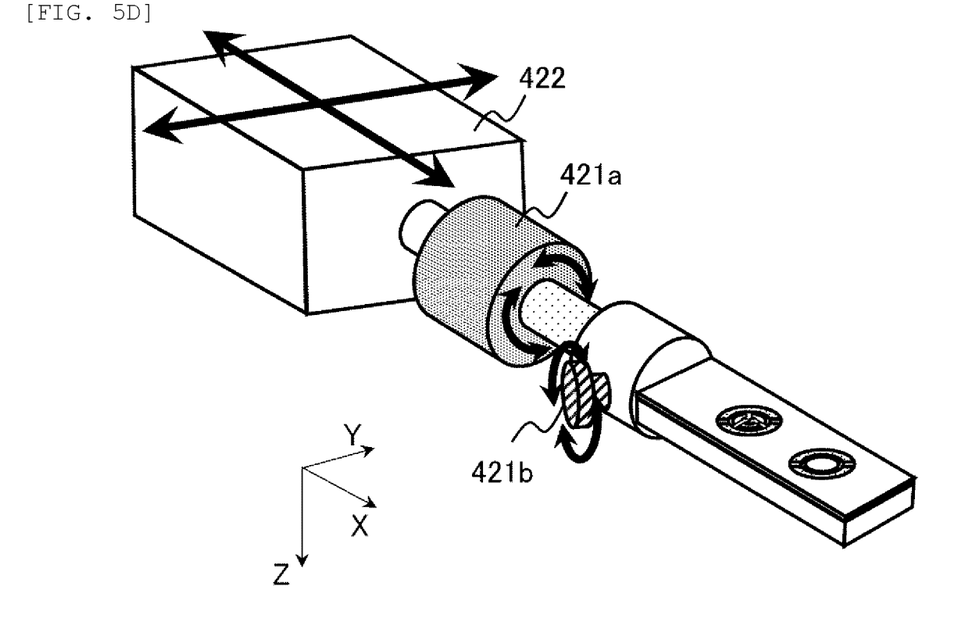
FIG. 5D is a diagram illustrating the configuration of the charged particle beam electrode.

Further, the electrode tilting mechanism 421 (421a) is connected to an electrode position adjusting mechanism 422 as shown in FIG. 5D. The electrode position adjusting mechanism 422 allows the electrode holder 405 to be translated. As shown in the drawing, the direction in which translation is possible is preferably two or more (in this example, the X-axis direction and the Y-axis direction). The electrode tilting mechanism 421 and the electrode position adjusting mechanism 422 may be driven manually or may be electrically driven with a stepping motor or a piezo element. The electrode tilting mechanism 421 is controlled by an electrode tilting mechanism controller 432, and the electrode position adjusting mechanism 422 is controlled by an electrode position adjusting mechanism controller 433.

The procedure for adjusting the incident angle of the charged particle beam to the first charged particle beam electrode 401 in the charged particle beam device of the second embodiment is the same as the procedure for adjusting the incident angle of the charged particle beam to the aperture in the first embodiment. Therefore, only the differences will be explained. In step S31, the charged particle beam aperture 404 is moved to the vicinity of the optical axis, and in step S35, the charged particle beam electrodes 401 and 402 are moved to the vicinity of the optical axis. Further, the subsequent adjustments are performed in a state where a predetermined voltage is applied between the first charged particle beam electrode 401 and the second charged particle beam electrode 402 in order to correct the aberration of the charged particle beam. Therefore, the images to be compared in step S39 are the image before aberration correction acquired in step S34 and the image after aberration correction by the charged particle beam electrode acquired in step S38. Therefore, in step S39, the inclination adjustment of the electrode holder is performed depending on whether or not the resolution of the image acquired before the aberration correction is equal to or higher than the expected value of the resolution including the improvement expected by the aberration correction. Then, it is determined whether or not to adjust the incident angle of the charged particle beam on the first charged particle beam electrode 401.

The inclination of the charged particle beam electrode may be adjusted once when the charged particle beam device is installed and then every time the charged particle beam source 101 is replaced. This is because when replacing a charged particle beam source, it is not possible to make it completely match the emission directions of the charged particle beam source and the charged particle beam before the replacement.

By adjusting the tilt of the electrode having an annular slit in this way, the optical axis of the charged particle beam can be incident perpendicular to the center of the electrode. As a result, the density of the charged particle beam passing through the annular slit becomes uniform and the correction action given to the charged particle beam divided by the slit at the electrode becomes uniform. As a result, the spherical aberration correction effect of the electrode having an annular slit can be stably obtained.

Third Embodiment

Figure 6:
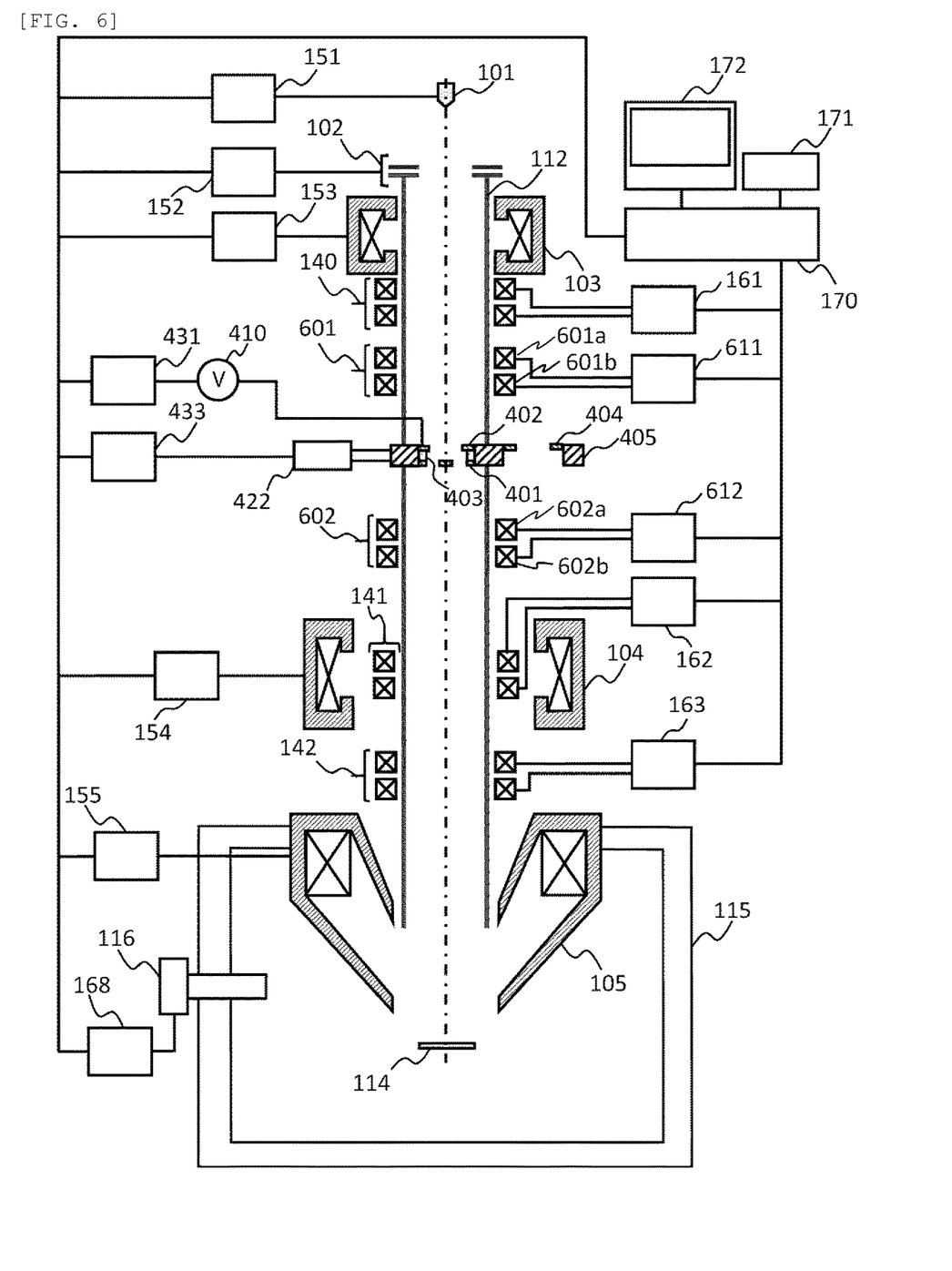
FIG. 6 is a schematic diagram of a charged particle beam device of a third embodiment.

FIG. 6 shows an outline of a charged particle beam device according to the third embodiment. The configurations common to the charged particle beam device according to the second embodiment are denoted by the same reference numerals and overlapping descriptions will be omitted. In the charged particle beam device according to the third embodiment, instead of the electrode tilting mechanism 421, a first correction deflector group 601 arranged on the charged particle beam source 101 side from the charged particle beam electrode and changing the angle of the charged particle beam incident on the charged particle beam electrode and a second correction deflector group 602 changing the angle of the charged particle beam passing through the charged particle beam electrode are provided. The first and second correction deflector groups 601 and 602 are controlled by the first and second correction deflector group controllers 611 and 612, respectively. The first correction deflector group 601 and the second correction deflector group 602 are adjusted so that the amount of deflection is the same and the charged particle beams are deflected in opposite directions to each other. The first and second correction deflector groups 601 and 602 may be those using an electric field or those using a magnetic field.

Figure 7:
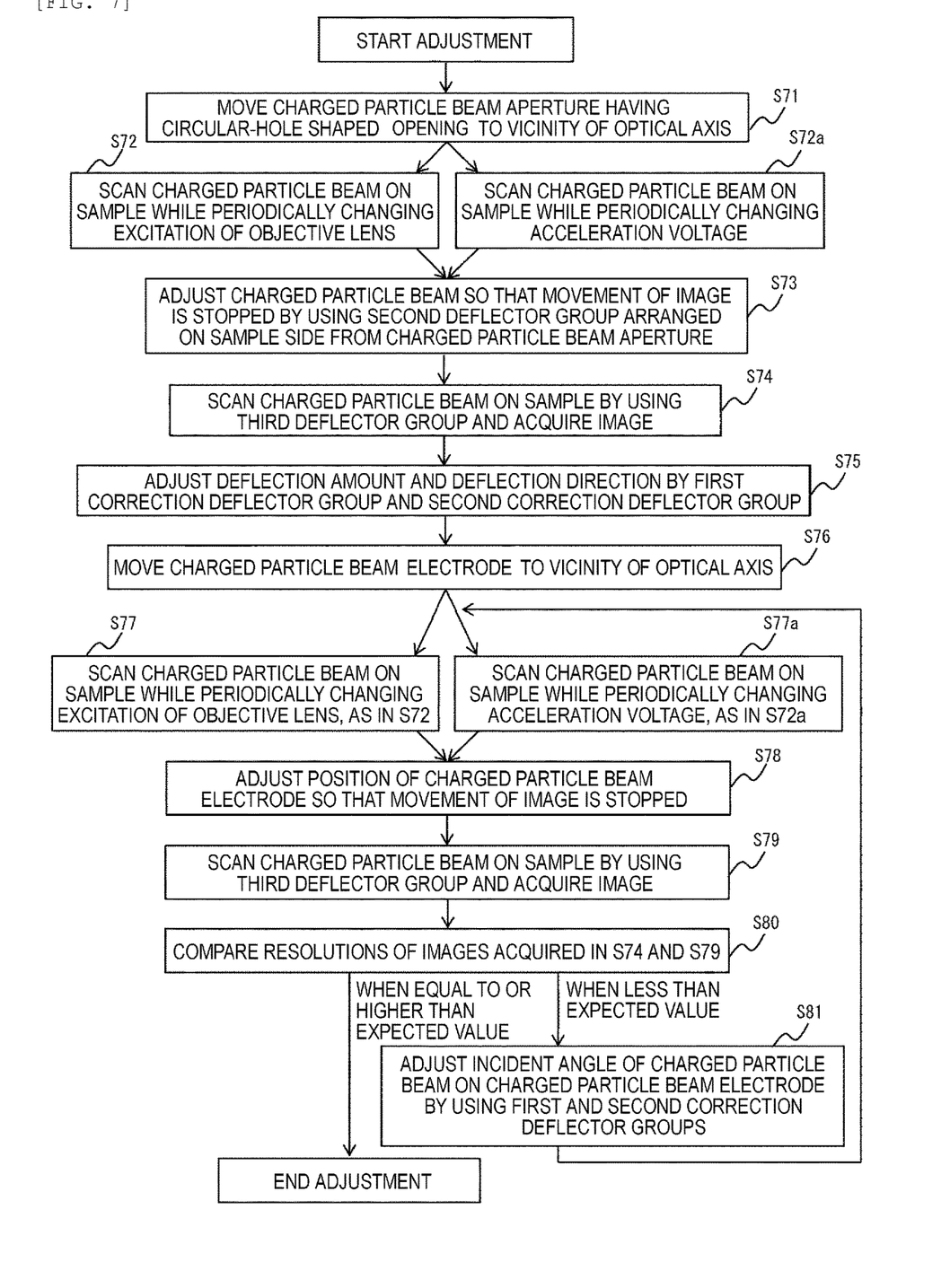
FIG. 7 is a flowchart showing a procedure for adjusting the incident angle of the charged particle beam to the electrode having an annular slit.

The procedure for adjusting the incident angle of the charged particle beam to the electrode having an annular slit in the charged particle beam device of the third embodiment will be described with reference to FIG. 7. Steps S71 to S74 are carried out in the same manner as in steps S31 to S34 in the first embodiment or the second embodiment shown in FIG. 3. Next, using the first and second correction deflector group controllers 611 and 612, the deflection amount and the deflection direction of the charged particle beam by the first correction deflector group 601 and the second correction deflector group 602 are adjusted (step S75).

The adjustment method of the correction deflector group will be described. First, the charged particle beam is scanned by the first deflector group 140. As the charged particle beam is scanned on the charged particle beam aperture 404, a circular charged particle beam image is displayed on the display 172. In this state, the charged particle beam is deflected by using an upper stage deflector 601a of the first correction deflector group 601. As a result, the position of the circular charged particle beam image moves, and thus, the charged particle beam is deflected using a lower deflector 601b so as to return to the position before deflection. In this way, the upper and lower stage deflection ratios of the first correction deflector group 601 are determined. Subsequently, the charged particle beam is scanned on the sample using the third deflector group 142 while periodically changing the excitation of the objective lens 105. At this time, if the optical axis does not pass through the center of the objective lens, the center of the image displayed on the display 172 moves in synchronization with the excitation fluctuation of the objective lens 105. Therefore, the path of the charged particle beam is adjusted so that the movement of the image is stopped by using the second correction deflector group 602. At this time, the upper and lower stage deflection ratios of the second correction deflector group 602 are set to be equal to the upper and lower stage deflection ratios of the first correction deflector group 601. In the output ratio of the first correction deflector group 601 and the second correction deflector group 602 when the movement of the image is stopped, the first correction deflector group 601 and the second correction deflector group 602 are adjusted so that the amount of deflection is the same and the charged particle beams are deflected in opposite directions to each other. Instead of periodically changing the excitation of the objective lens 105, the acceleration voltage of the charged particle beam may be changed periodically.

Although FIG. 6 shows an example in which the correction deflector group is each composed of upper and lower two-stage deflectors, each may be composed of a one-stage deflector. The adjustment method in this case will be described. First, the charged particle beam is scanned by the first deflector group 140. As the charged particle beam is scanned on the charged particle beam aperture 404, a circular charged particle beam image is displayed on the display 172. In this state, the charged particle beam is deflected by using the first correction deflector group 601. At this time, when the circular charged particle beam image is dark, the position of the charged particle beam aperture 404 is adjusted with the electrode position adjusting mechanism 422 so that the charged particle beam image becomes the brightest. Subsequently, the charged particle beam is scanned on the sample using the third deflector group 142 while periodically changing the excitation of the objective lens 105. At this time, if the optical axis does not pass through the center of the objective lens, the center of the image displayed on the display 172 moves in synchronization with the excitation fluctuation of the objective lens 105. Therefore, the path of the charged particle beam is adjusted so that the movement of the image is stopped by using the second correction deflector group 602. In the output ratio of the first correction deflector group 601 and the second correction deflector group 602 when the movement of the image is stopped, the first correction deflector group 601 and the second correction deflector group 602 are adjusted so that the amount of deflection is the same and the charged particle beams are deflected in opposite directions to each other. Instead of periodically changing the excitation of the objective lens 105, the acceleration voltage of the charged particle beam may be changed periodically.

Steps S76 to S79 are carried out in the same manner as in steps S35 to S38 in the second embodiment. As a result, in step S80, when the resolution of the image acquired in step S79 is less than the expected value of the resolution obtained by adding the improvement expected by the aberration correction to the resolution of the image acquired in step S74, the incident angle of the charged particle beam with respect to the first charged particle beam electrode 401 is adjusted by using the first and second correction deflector groups 601 and 602 so that the image resolution is improved (step S81). In this adjustment, the output ratio of the first correction deflector group 601 and the second correction deflector group 602 maintains the output ratio adjusted in step S75. As a result, even if the inclination of the charged particle beam is changed, the charged particle beam passes through the center of the objective lens.

After that, the steps following step S77 (S77a) are repeatedly executed as necessary, and when the resolution of the image acquired in step S79 is equal to or higher than the expected value of the image resolution, the adjustment is terminated. The improvement in resolution is due to the improvement in the verticality between the optical axis of the charged particle beam and the first charged particle beam electrode 401.

In the present embodiment, the optical axis of the charged particle beam can be incident perpendicular to the center of the electrode by adjusting the incident angle of the charged particle beam on the electrode having an annular slit. As a result, the density of the charged particle beam passing through the annular slit becomes uniform, and the correction action given to the charged particle beam divided by the slit at the electrode becomes uniform. As a result, the spherical aberration correction effect of the electrode having an annular slit can be stably obtained.

The incident angle of the charged particle beam on the charged particle beam electrode may be adjusted once when the charged particle beam device is installed and then every time the charged particle beam source 101 is replaced. This is because when replacing a charged particle beam source, it is not possible to make it completely match the emission directions of the charged particle beam source and the charged particle beam before the replacement.

In order to improve the verticality between the optical axis of the charged particle beam and the first charged particle beam aperture 118 with respect to the configuration of the first embodiment, the incident angle of the charged particle beam to the first charged particle beam aperture 118 can be adjusted by using the first correction deflector group 601 and the second correction deflector group 602 in the third embodiment. In this case, as in the first embodiment, the effect of improving the depth of focus by the aperture having an annular slit can be stably obtained.

REFERENCE SIGNS LIST

101: charged particle source, 102: acceleration electrode, 103: first condenser lens, 104: second condenser lens, 105: objective lens, 112: beam tube, 114: sample, 115: sample chamber, 116: detector, 118: first charged particle beam aperture, 119: second charged particle beam aperture, 120: aperture holder, 121: aperture tilting mechanism, 122: aperture position adjusting mechanism, 140: first deflector group, 141: second deflector group, 142: third deflector group, 151: charged particle source controller, 152: acceleration electrode controller, 153: first condenser lens controller, 154: second condenser lens controller, 155: objective lens controller, 156: aperture tilting mechanism controller, 157: aperture position adjusting mechanism controller, 161: first deflector group controller, 162: second deflector group controller, 163: third deflector group controller, 168: detector controller, 170: integrated computer, 171: controller, 172: display, 180: plate, 182: holding plate, 183: support member, 401: first charged particle beam electrode, 402: second charged particle beam electrode, 403: insulating member, 404: charged particle beam aperture, 405: electrode holder, 406: holding plate, 410: electrode power supply, 421: electrode tilting mechanism, 422: electrode position adjusting mechanism, 431: electrode power supply controller, 432: electrode tilting mechanism controller, 433: electrode position adjusting mechanism controller, 501: electrode unit, 511: upper spacer, 512: middle spacer, 513: lower spacer, 514: electrode retainer, 515: insulating case, 516: holding screw, 601: first correction deflector group, 602: second correction deflector group, 611: first correction deflector group controller, 612: second correction deflector group controller.

The invention claimed is:

1. A charged particle beam device comprising:
   a charged particle beam source that generates a charged particle beam;
   a first charged particle beam aperture having an annular slit;
   an aperture holder that holds the first charged particle beam aperture;
   an aperture position adjusting mechanism that moves the aperture holder on a plane stretched by a first axis and a second axis orthogonal to the first axis; and
   an aperture tilting mechanism that adjusts an incident angle of the charged particle beam on the first charged particle beam aperture.

2. The charged particle beam device according to claim 1, wherein
   the aperture tilting mechanism includes a first aperture tilting mechanism that tilts the first charged particle beam aperture held in the aperture holder with the first axis as an axis, and a second aperture tilting mechanism that tilts the first charged particle beam aperture held in the aperture holder with the second axis as an axis, and
   a center of the first charged particle beam aperture is located on the first axis.

3. The charged particle beam device according to claim 2, wherein
   the aperture holder holds a second charged particle beam aperture having a circular hole-shaped opening, and
   the center of the first charged particle beam aperture and a center of the second charged particle beam aperture are located on the first axis.

4. The charged particle beam device according to claim 3, further comprising:
   an objective lens that focuses the charged particle beam on a sample;
   a detector that detects secondary charged particles emitted by irradiating the sample with the charged particle beam; and
   a computer that forms an image based on the secondary charged particles detected by the detector, wherein the aperture tilting mechanism is adjusted so that a resolution of a first image acquired by passing the charged particle beam through the first charged particle beam aperture is equal to or higher than a resolution of a second image acquired by passing the charged particle beam through the second charged particle beam aperture.

5. A charged particle beam device comprising:
a charged particle beam source that generates a charged particle beam;
a first charged particle beam electrode having an annular slit;
a second charged particle beam electrode arranged to face the first charged particle beam electrode and having a circular hole-shaped opening;
an electrode holder that holds the first charged particle beam electrode and the second charged particle beam electrode;
an electrode power supply that applies a voltage between the first charged particle beam electrode and the second charged particle beam electrode;
an electrode position adjusting mechanism that moves the electrode holder on a plane stretched by a first axis and a second axis orthogonal to the first axis; and
an electrode tilting mechanism that adjusts an incident angle of the charged particle beam to the first charged particle beam electrode.

6. The charged particle beam device according to claim 5, wherein
the electrode tilting mechanism includes a first electrode tilting mechanism that tilts the first charged particle beam electrode and the second charged particle beam electrode held in the electrode holder with the first axis as an axis, and a second aperture tilting mechanism that tilts the first charged particle beam electrode and the second charged particle beam electrode held in the electrode holder with the second axis as an axis, and
a center of the first charged particle beam electrode is located on the first axis.

7. The charged particle beam device according to claim 6, wherein
the electrode holder holds a charged particle beam aperture having a circular hole-shaped opening, and
the center of the first charged particle beam electrode and a center of the charged particle beam aperture are located on the first axis.

8. The charged particle beam device according to claim 7, further comprising:
an objective lens that focuses the charged particle beam on a sample;
a detector that detects secondary charged particles emitted by irradiating the sample with the charged particle beam; and
a computer that forms an image based on the secondary charged particles detected by the detector, wherein
the electrode tilting mechanism is adjusted so that a resolution of a first image acquired by passing the charged particle beam through the first charged particle beam electrode and the second charged particle beam electrode in a state where a predetermined voltage is applied between the first charged particle beam electrode and the second charged particle beam electrode from the electrode power supply is equal to or higher than an expected value based on a resolution of a second image acquired by passing the charged particle beam through the charged particle beam aperture.

9. A charged particle beam device comprising:
a charged particle beam source that generates a charged particle beam;
a first charged particle beam aperture having an annular slit;
an aperture holder that holds the first charged particle beam aperture;
an aperture position adjusting mechanism that moves the aperture holder on a plane stretched by a first axis and a second axis orthogonal to the first axis; and
a first deflector group that deflects the charged particle beam incident on the first charged particle beam aperture, wherein
an incident angle on the first charged particle beam aperture is adjusted by deflecting the charged particle beam with the first deflector group.

10. The charged particle beam device according to claim 9, further comprising:
a second deflector group that deflects the charged particle beam passing through the first charged particle beam aperture, wherein
an amount of deflection of the charged particle beam by the first deflector group is equal to an amount of deflection of the charged particle beam by the second deflector group, and deflection directions are opposite to each other.

11. The charged particle beam device according to claim 10, wherein
the aperture holder holds a second charged particle beam aperture having a circular hole-shaped opening, and
a center of the first charged particle beam aperture and a center of the second charged particle beam aperture are located on the first axis.

12. The charged particle beam device according to claim 11, further comprising:
an objective lens that focuses the charged particle beam on a sample;
a detector that detects secondary charged particles emitted when the charged particle beam irradiates the sample; and
a computer that forms an image based on the secondary charged particles detected by the detector, wherein
an amount of deflection of the charged particle beam by the first deflector group and an amount of deflection of the charged particle beam by the second deflector group are adjusted so that a resolution of a first image acquired by passing the charged particle beam through the first charged particle beam aperture is equal to or higher than a resolution of a second image acquired by passing the charged particle beam through the second charged particle beam aperture.

13. A charged particle beam device comprising:
a charged particle beam source that generates a charged particle beam;
a first charged particle beam electrode having an annular slit;
a second charged particle beam electrode arranged to face the first charged particle beam electrode and having a circular hole-shaped opening;
an electrode holder that holds the first charged particle beam electrode and the second charged particle beam electrode;
an electrode power supply that applies a voltage between the first charged particle beam electrode and the second charged particle beam electrode;

an electrode position adjusting mechanism that moves the electrode holder on a plane stretched by a first axis and a second axis orthogonal to the first axis; and a first deflector group that deflects the charged particle beam incident to the first charged particle beam electrode, wherein an incident angle on the first charged particle beam electrode is adjusted by deflecting the charged particle beam with the first deflector group.

14. The charged particle beam device according to claim 13, further comprising:

a second deflector group that deflects the charged particle beam passing through the first charged particle beam electrode and the second charged particle beam electrode, wherein an amount of deflection of the charged particle beam by the first deflector group is equal to an amount of deflection of the charged particle beam by the second deflector group, and deflection directions are opposite to each other.

15. The charged particle beam device according to claim 14, wherein the electrode holder holds a charged particle beam aperture having a circular hole-shaped opening, and a center of the first charged particle beam electrode and a center of the charged particle beam aperture are located on the first axis.

16. The charged particle beam device according to claim 15, further comprising:

an objective lens that focuses the charged particle beam on a sample;

a detector that detects secondary charged particles emitted when the charged particle beam irradiates the sample; and a computer that forms an image based on the secondary charged particles detected by the detector, wherein an amount of deflection of the charged particle beam by the first deflector group and an amount of deflection of the charged particle beam by the second deflector group are adjusted so that a resolution of a first image acquired by passing the charged particle beam through the first charged particle beam electrode and the second charged particle beam electrode in a state where a predetermined voltage is applied between the first charged particle beam electrode and the second charged particle beam electrode from the electrode power supply is equal to or higher than an expected value based on a resolution of a second image acquired by passing the charged particle beam through the charged particle beam aperture.

* * * * *